United States Patent
Huang et al.

(10) Patent No.: US 7,528,414 B2
(45) Date of Patent: May 5, 2009

(54) LIGHT EMITTING DIODE PACKAGE STRUCTURE

(75) Inventors: Tien-Fu Huang, Hsinchu County (TW); Chin-Yin Yu, Yilan County (TW); Kuo-Chang Hu, Miaoli County (TW); Shyh-Rong Tzan, Hsinchu County (TW); Shi-How Hua, Changhua County (TW)

(73) Assignee: Industrial Technology Reseach Institute, Hsinchu (TW)

( * ) Notice: Subject to any disclaimer, the term of this patent is extended or adjusted under 35 U.S.C. 154(b) by 111 days.

(21) Appl. No.: 11/672,844

(22) Filed: Feb. 8, 2007

(65) Prior Publication Data

US 2008/0079019 A1 Apr. 3, 2008

(30) Foreign Application Priority Data

Oct. 2, 2006 (TW) .............................. 95136540 A (51) Int. Cl.
*H01L 31/0224* (2006.01)

(52) U.S. Cl. .............................. 257/79; 257/98; 257/99; 257/100; 257/676; 257/E33.056; 257/E33.057; 257/E33.058; 257/E33.066

(58) Field of Classification Search .................. 257/98, 257/99, 100, 676, E33.056, E33.057, E33.058, 257/E33.066, E33.075

See application file for complete search history.

(56) References Cited

U.S. PATENT DOCUMENTS

| 6,274,924 | B1 | 8/2001 | Carey et al. | |
|---|---|---|---|---|
| 6,376,902 | B1 | 4/2002 | Arndt | |
| 2002/0153835 | A1* | 10/2002 | Fujiwara et al. | 313/512 |
| 2002/0163001 | A1* | 11/2002 | Shaddock | 257/79 |
| 2004/0238930 | A1 | 12/2004 | Arndt | |
| 2004/0256706 | A1* | 12/2004 | Nakashima | 257/678 |

FOREIGN PATENT DOCUMENTS

CN 1728411 (A) 2/2006

* cited by examiner

*Primary Examiner*—Ngan Ngo
*Assistant Examiner*—Benjamin Tzu-Hung Liu
(74) *Attorney, Agent, or Firm*—Quintero Law Office (57) ABSTRACT

A light emitting diode (LED) package structure is disclosed. The LED package structure comprises a lead frame which has a chip carrier part, a pair of extended parts, a first electrode and a second electrode. The chip carrier part has an arc frame, a bulge, a first surface and a second surface. The extended part has a first side, a second side, a first top and a first bottom. The first side connects the arc frame of the chip carrier part. The arc frame electrically connects the first electrode. A heat dissipating material is placed on the second surface.

17 Claims, 10 Drawing Sheets

LIGHT EMITTING DIODE PACKAGE STRUCTURE

BACKGROUND OF THE INVENTION

1. Field of the Invention

The invention relates to a light emitting diode (LED) package structure, and more particularly to a high power LED package structure.

2. Description of the Related Art

Figure 1A:
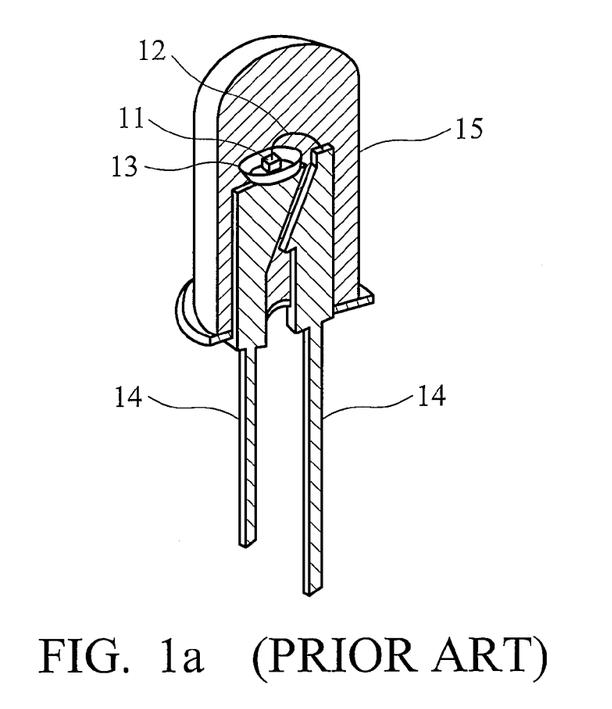
FIG. 1a shows a conventional lamp type LED package structure produced by Luxeon Corp.
Figure 1B:
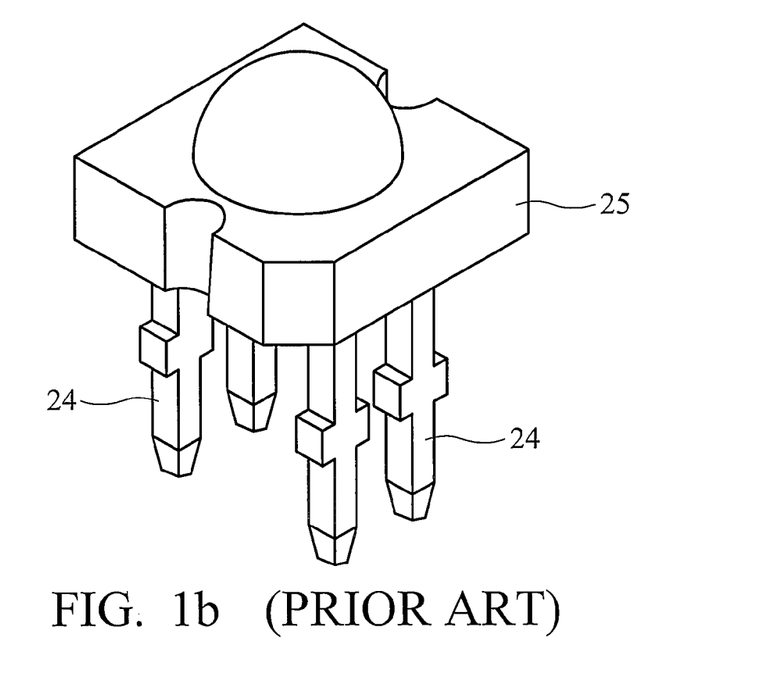
FIG. 1b shows a stereogram of a conventional piranha LED package structure.
Figure 1C:
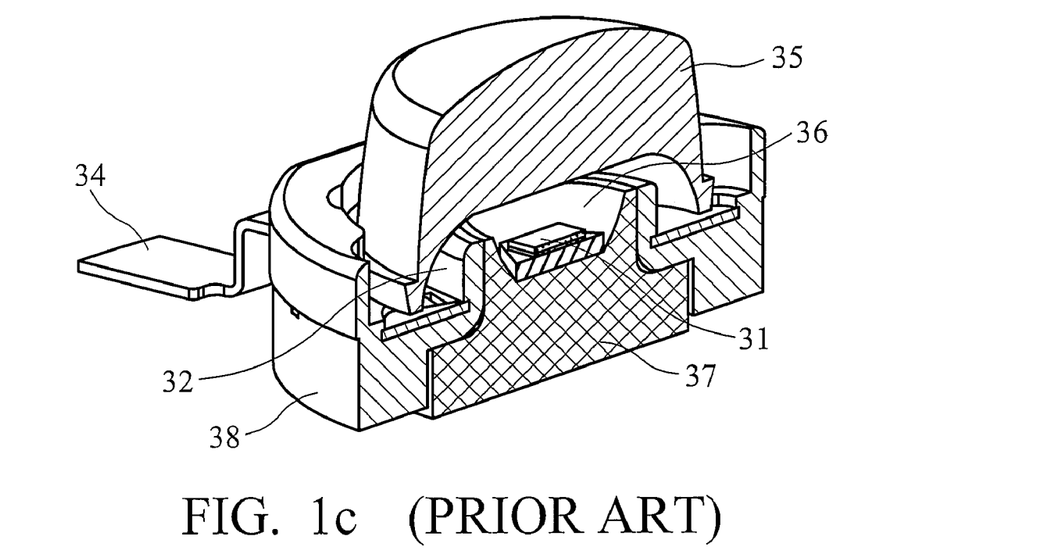
FIG. 1c shows a conventional high power LED package structure produced by Luxeon Corp.

Various LED package structures are designed to address various optical, electrical and thermal performance problems LEDs with higher input power. The three LED package structures in use, lamp type LED, piranha LED and high power LED, are classified according to input power. FIG. 1a shows a conventional lamp type LED package structure produced by Luxeon Corp. (Luxeon Reliability Application Brief AB25). The main packaging element of the conventional lamp type LED package structure comprises an LED chip 11, a die attachment (not shown), a wire bonding 12, a reflector cup 13, a lead frame 14 and a lens 15. The lens may have one of a variety of optical designs according to various optical requirements. The largest LED chip in a conventional lamp type LED is about 0.35×0.35 mm$^2$, and the maximum input power is about 0.1 watts. Because the input power is low, the lamp type LED package structure can not address electrical performance and thermal problems. To meet LED brightness requirements, an LED package structure with higher input power is desirable. FIG. 1b shows a stereogram of a conventional piranha LED package structure. Compared with the lamp type LED, the input power of the piranha LED is about 0.2 to 0.5 watts. The main packaging element of the conventional piranha LED package structure comprises an LED chip (not shown), a die attachment (not shown), a wire bonding (not shown), a reflector cup (not shown), a lead frame 24 and a lens 25. The LED chip of the conventional piranha LED is about 0.35×0.35 mm$^2$ to 0.61×0.61 mm$^2$. The main packaging elements of the piranha LED package structure are substantially the same as the lamp type LED. The lead frame of the piranha LED package structure has four leads, two more than the lamp type LED. The lead frame of the piranha LED package structure provides a better heat dissipating path than the lamp type LED, improving thermal performance. The piranha LED package structure may be soldered on a printed circuit board (PCB) by pin through hole or surface mount technology. FIG. 1c shows a conventional high power LED package structure produced by Luxeon Corp. (Luxeon Reliability Application Brief AB25), with input power is about 1 to 5 watts. The main packaging element of the conventional high power LED package structure comprises an LED chip 31, a wire bonding 32, a lead frame 34, a plastic lens 25, a silicone encapsulant 36, a heat slug 37, and a plastic case 38. The LED chip of the conventional high power LED is greater at about 1.0×1.0 mm$^2$. Electrical performance and thermal performance of the high power LED package structure must be considered. Unless using the packaging elements of the lamp type LED, a heat slug, must be included in the high power LED package structure. Other designs are also required to prevent electrical overstress (EOS) by electrostatic discharge (ESD).

Figure 1D:
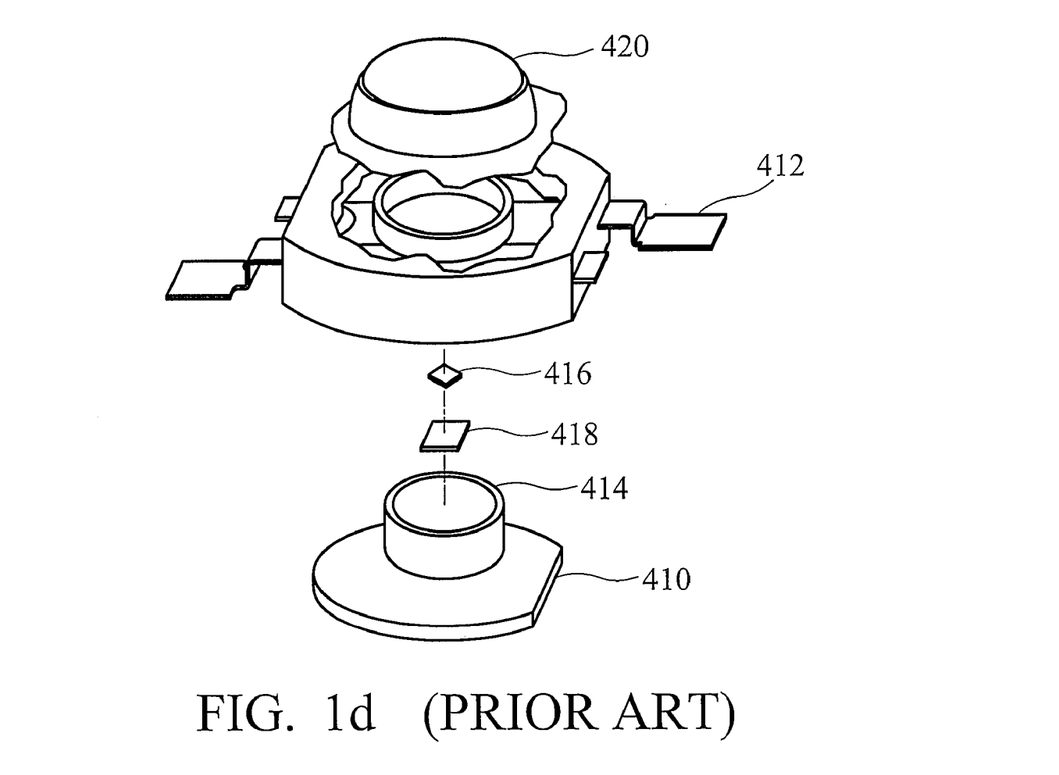
FIG. 1d shows a conventional high power LED package structure disclosed in U.S. Pat. No. 6,274,924 B1.
Figure 1E:
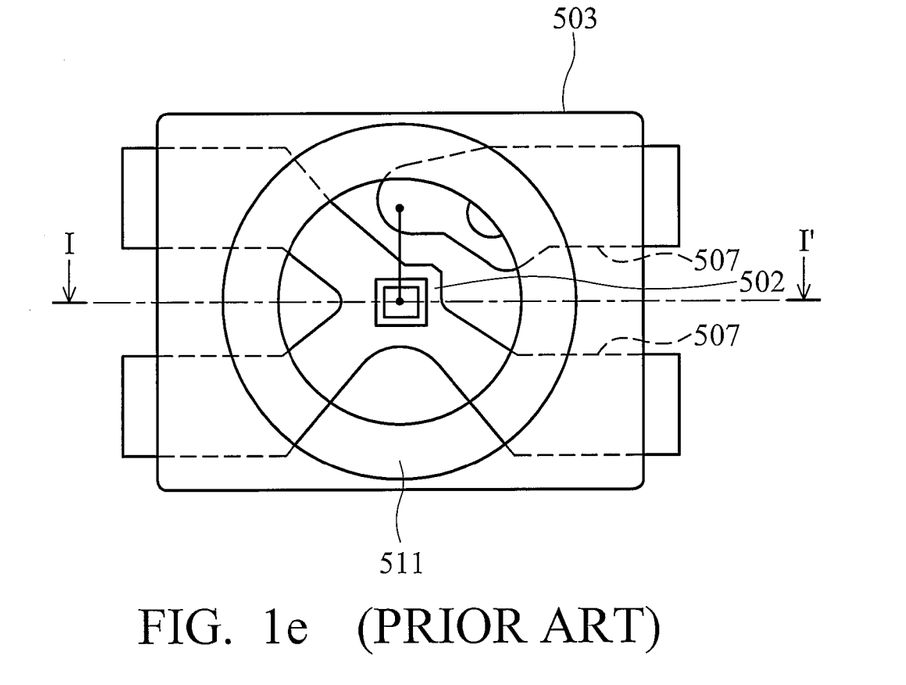
FIG. 1e shows a conventional high power LED package structure disclosed in U.S. Pat. No. 6,376,902 B1 and U.S. Pat. No. 2004/0238930 A1.
Figure 1F:
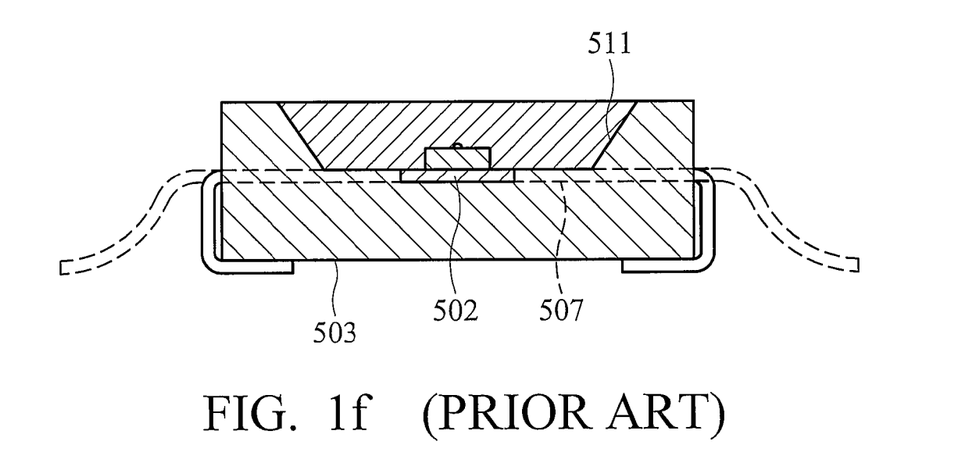
FIG. 1f shows a cross section taken substantially along line I-I' of FIG. 1e.

Because of their differing package structures, processes for fabricating lamp type LED, piranha LED and high power LED package structures are different. In the lamp type piranha LED, injection molding first forms a lead frame, the reflector cup is then formed on the lead frame, and bending the lead frame forms the lead. The lead frame of the lamp type LED or the piranha LED is thus completely formed. Next, an LED chip is placed on the reflector cup. A wire bonding is subsequently bonded to the LED chip and the lead. The lead frame is then placed in a mold cup, the cup is then filled with epoxy to form a lens. After hardening by heat, the lens is removed from the mold cup, and excess parts are excised to form the lamp type LED or the piranha LED package structures. The aforementioned manufacturing method of the lamp type LED or the piranha LED package structures has advantages of high throughput and low cost. The high power LED package structure may comprise a heat slug for dissipating a heat generated from the LED chip. FIG. 1d shows a conventional high power LED package structure disclosed in U.S. Pat. No. 6,274,924 B1. The main packaging element of the conventional high power LED package structure, as shown in FIG. 1d, comprises a heat slug 410, a lead frame combined with a housing 412, a reflector cup 414, an LED chip 416, a submount 418, and a lens 420. For the conventional high power LED package structure as shown in FIG. 1d, a housing is combined with a lead frame to form lead frame combined housing 412 for insulation. The lead frame combined housing 412, the lens 420, the LED chip 416 and the heat slug 410 are constructed together to form the conventional high power LED package structure as shown in FIG. 1d. The heat slug of the high power LED package structure may be disposed by various methods. FIG. 1e shows a conventional high power LED package structure disclosed in U.S. Pat. No. 6,376,902 B1 and U.S. Pat. No. 2004/0238930 A1, and FIG. 1f shows a cross section taken substantially along line I-I' of FIG. 1e. A heat slug 502 is directly combined with a lead frame 507 and a housing 503. A recess 511, in an inner side of the housing 503, may be coated with a reflective material to form a reflective cup. The conventional high power LED package structure as shown in FIG. 1e is a semi-finished product formed by directly combining the heat slug 502, the lead frame 507 and the housing 503.

High power LEDs in a lamp type LED package structure are an appropriate choice when no particular brightness requirements exist, due to the relatively lower manufacturing costs thereof. To balance LED brightness with manufacturing cost, high the piranha LED package structure is also an economical choice. The piranha LED package structure, however, suffers from poor thermal performance due to heat dissipation problems while using the high power LED. According to the document "Advanced thermal design of electronic equipment" by Rensburg Ralph, 1997, the reliability of electronic products is reduced by about 50% when the temperature of the LED chip increases by about 10° C. Additionally, the brightness and life of the LED chip are reduced when the LED chip temperature is increased.

A high power LED package structure with lower thermal resistance capable of improving reliability and preventing brightness decay of an LED chip is desirable.

BRIEF SUMMARY OF INVENTION

A detailed description is given in the following embodiments with reference to the accompanying drawings.

A light emitting diode package structure is provided. An exemplary embodiment of a light emitting diode package structure comprises: a lead frame having a chip carrier, a pair of extended parts, a first electrode and a second electrode. The chip carrier comprises an arc frame and a bulge, the described extended part comprises a first side, a first top and a first bottom. The first side is connected to the arc frame of the chip carrier. The first and second electrodes are each connected by a connector and a pair of leads. The arc frame is electrically connected to the first electrode and the connector of the first electrode is electrically connected to the lead of the first electrode. The connector of the second electrode electrically connected to the lead of the second electrode. The chip carrier has a first surface and a second surface. The second surface is opposite to the first surface. A light emitting diode chip is disposed on the first surface of the chip carrier. A conductive wire comprising two terminals is connected to the light emitting diode chip and the connector of the second electrode. A packaging material having a first thermal conductivity covers the lead frame and the light emitting diode chip.

Another exemplary embodiment of a light emitting diode package structure comprises: a lead frame having a chip carrier, a pair of extended parts, a first electrode and a second electrode. The chip carrier comprises an arc frame and a bulge, the described extended part comprises a first side, a first top and a first bottom. The first side is connected to the arc frame of the chip carrier. The first and second electrodes are each connected by a connector and a pair of leads. The arc frame is electrically connected to the first electrode and the connector of the first electrode is electrically connected to the lead of the first electrode. The connector of the second electrode electrically connected to the lead of the second electrode. The chip carrier has a first surface and a second surface. The second surface is opposite to the first surface. A light emitting diode chip is on the first surface of the chip carrier. A conductive wire comprising two terminals is connected to the light emitting diode chip and the connector of the second electrode. A packaging material having a first thermal conductivity covers the lead frame and the light emitting diode chip. The light emitting diode package structure further comprises: a heat dissipating material placed on the second surface of the chip carrier. The heat dissipating material has a second top, a second bottom, a pair of third sides, and a pair of fourth sides. The second top of the dissipating material contacts the second surface of the chip carrier and the first bottom of the extended part.

BRIEF DESCRIPTION OF DRAWINGS

The invention can be more fully understood by reading the subsequent detailed description and examples with references made to the accompanying drawings, wherein:

FIG. 5b is a simulation result showing a temperature distribution of the exemplary embodiment of a high power LED package structure as shown in FIG. 3a.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
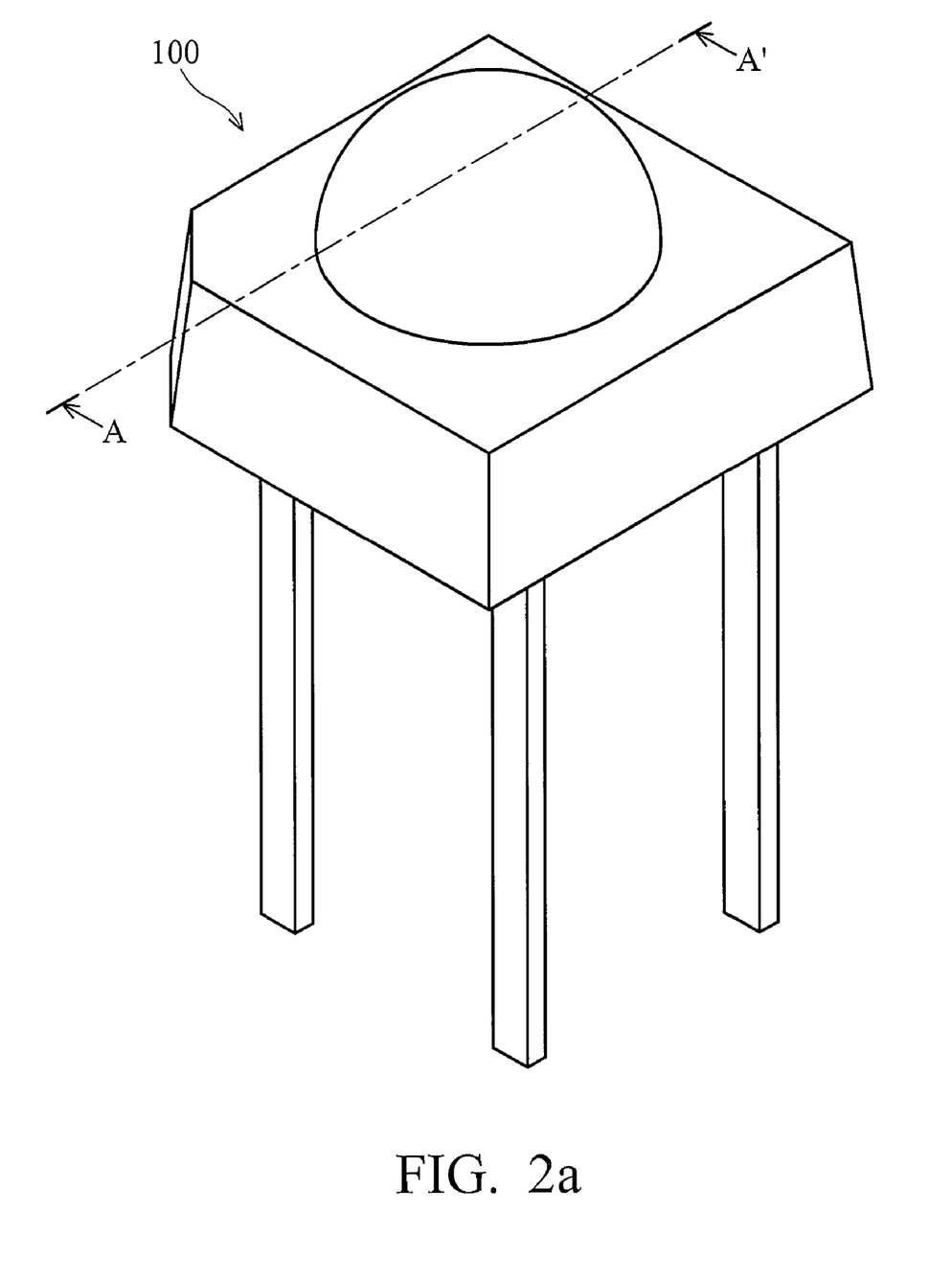
FIG. 2a shows a stereogram of an exemplary embodiment of a high power LED package structure.
Figure 2B:
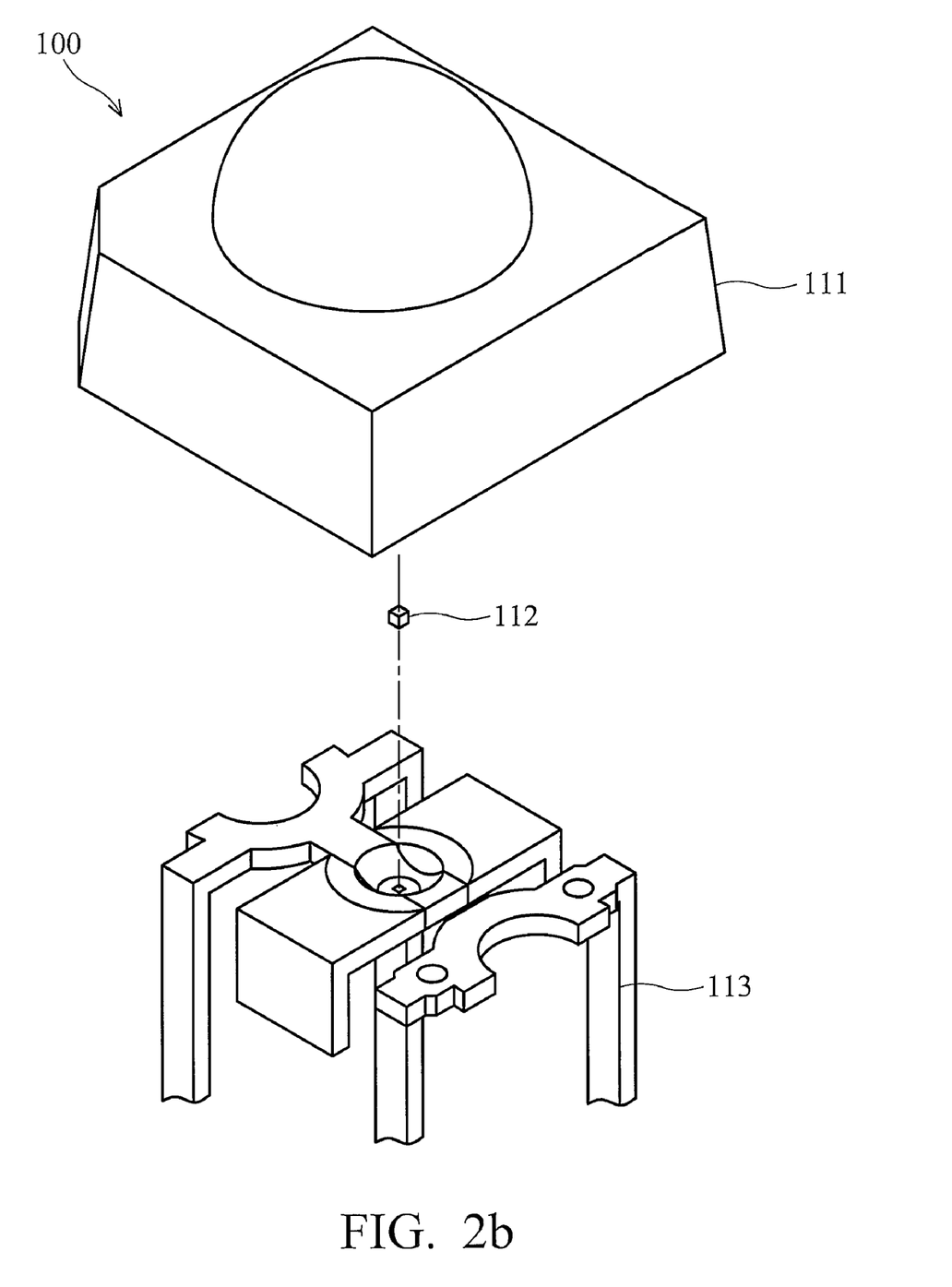
FIG. 2b shows an assembling diagram of an exemplary embodiment of a high power LED package structure.

FIG. 2a shows a stereogram of an exemplary embodiment of a high power LED package structure 100. FIG. 2b shows an diagram showing the steps of assembling an exemplary embodiment of the high power LED package structure 100. The primary packaging element of the high power LED package structure 100 comprises a packaging material 111, a high power LED chip 112 and a lead frame 113. The lead frame 113 comprises Au, Ag, Cu, W, Ni, Si, Al, Mo or an alloy thereof, ceramic composite, diamond-like material and metal oxide or other conductive materials. The lead frame 113 is formed by injection molding.

First Embodiment

Figure 3A:
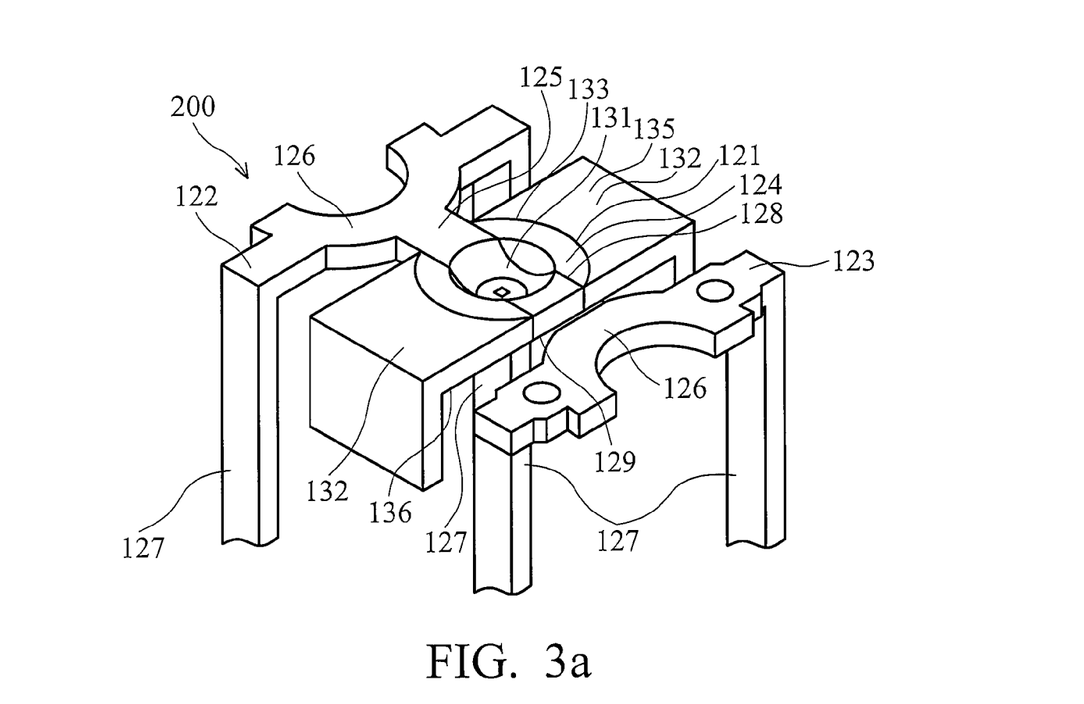
FIG. 3a shows a stereogram of an exemplary embodiment of a lead frame of a high power LED package structure.
Figure 3B:
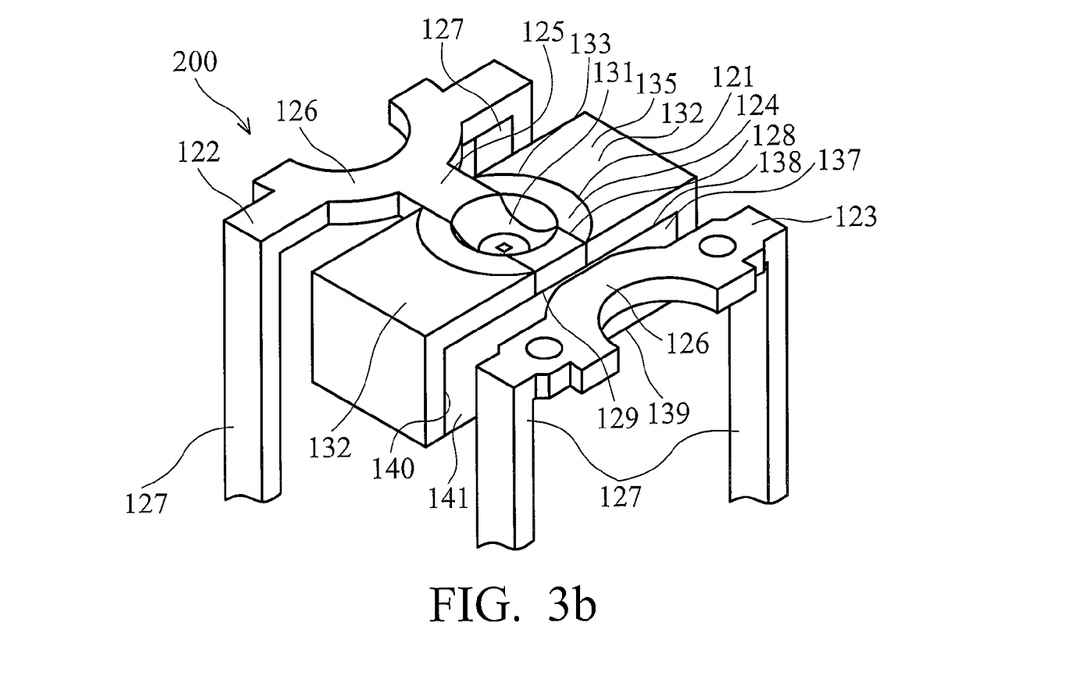
FIG. 3b shows a stereogram of another exemplary embodiment of a lead frame combined with a heat dissipating material of a high power LED package structure.
Figure 4:
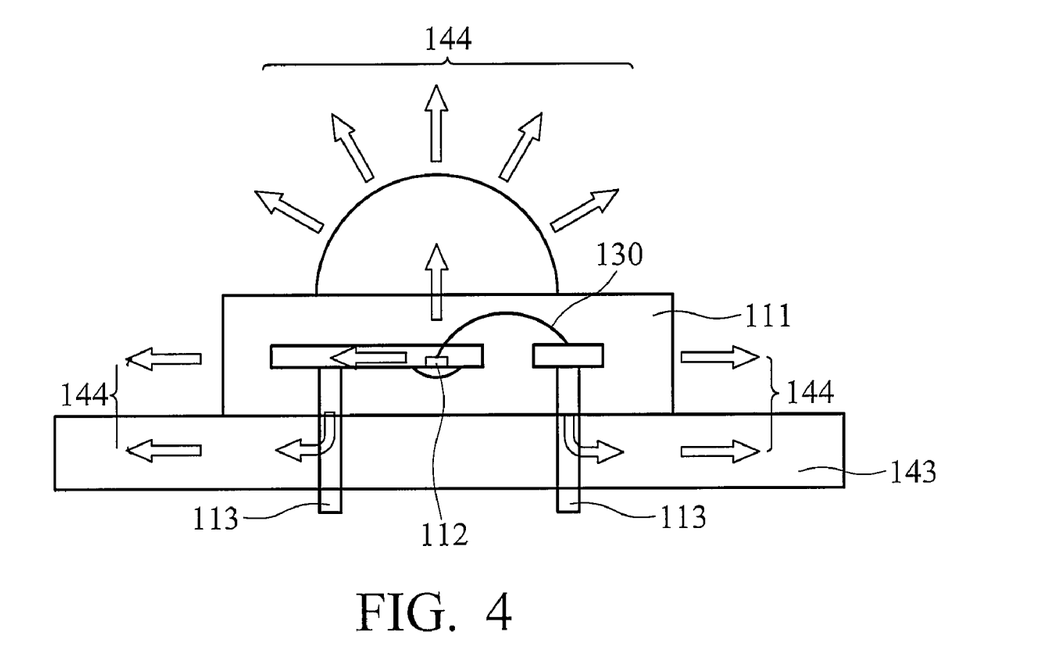
FIG. 4 is a front view/cross section taken substantially along line A-A' of FIG. 2a showing the heat dissipating path of an exemplary embodiment of a high power LED package structure placed on a printed circuit board (PCB).

FIG. 3a shows a stereogram of an exemplary embodiment of a lead frame 200 of a high power LED package structure 100. The lead frame 200 comprises a chip carrier 121, a pair of extended parts 132, a first electrode 122 and a second electrode 123. The chip carrier 121 has an arc frame 124 and a bulge 125. The extended part 132 has a first side 133, a first top 135 and a first bottom 136. The first side 133 is connected to the arc frame 124 of the chip carrier 121. Each of the first electrode 122 and the second electrode 123 has a connector 126 and a pair of leads 127. The arc frame 124 is electrically connected to the first electrode 122. The connector 126 of the first electrode 122 is electrically connected to the lead 127 of the first electrode 122. The connector 126 of the second electrode 123 is electrically connected to the lead 127 of the second electrode 123. The chip carrier 121 has a first surface 128 and a second surface 129, wherein the second surface 129 is opposite to the first surface 128. The chip carrier 121 is used for carrying a high power LED chip 112 with input power greater than 1 watt. The first surface 128 of the chip carrier 121 has a recess 131 serving as a reflector cup with an optical function. The high power LED chip 112 is connected to the recess 131 using a chip adhesive (not shown), for example, silver adhesive. The shape of the connection part 132 comprises a planar shape, an L-shape, or the like. FIG. 4 shows the formation of a conductive wire 130. The conductive wire 130 has two terminals connected to the light emitting diode chip 112 and the connector 126 of the second electrode 122 as shown in FIG. 3a and FIG. 3b, respectively. The conductive wire 130 may comprise Au, Ag, Cu, W, Ni, Si, Al, Mo or an alloy thereof, ceramic composite, diamond-like material, metal oxide or other conductive materials. Next, a packaging material 111 encapsulates and protects the light emitting diode chip 112 and the lead frame 113. The packaging material 111 comprises epoxy, which may also serve as a lens of the high power LED package structure 100. The packaging material 111 is formed by mold filling. The lens and the package structure are formed at the same time. Thus, fabrication of the high power LED package structure 100 is complete.

Second Embodiment

FIG. 3b shows a stereogram of another exemplary embodiment of a lead frame 200 combined with a heat dissipating material 137 of the high power LED package structure 100. A heat dissipating material 137 is placed on the second surface 129 of the chip carrier 121. The heat dissipating material 137 has a second top 138, a second bottom 139, a pair of third sides 140, and a pair of fourth sides 141. The second top 138 of the dissipating material 137 connects to the second surface 129 of the chip carrier 121 and the first bottom 136 of the extended part 132. The packaging material 111 as shown in FIG. 2b has a bottom (not shown). The second bottom 139 of the heat dissipating material 137 may be aligned with or bulge out to the bottom of the packaging material 111. The heat dissipating material 137 has a thermal conductivity greater than the packaging material 111. The same elements as shown in FIG. 3a can be referred to in the aforementioned description and are not repeated for brevity.

Comparative Embodiment

Figure 3C:
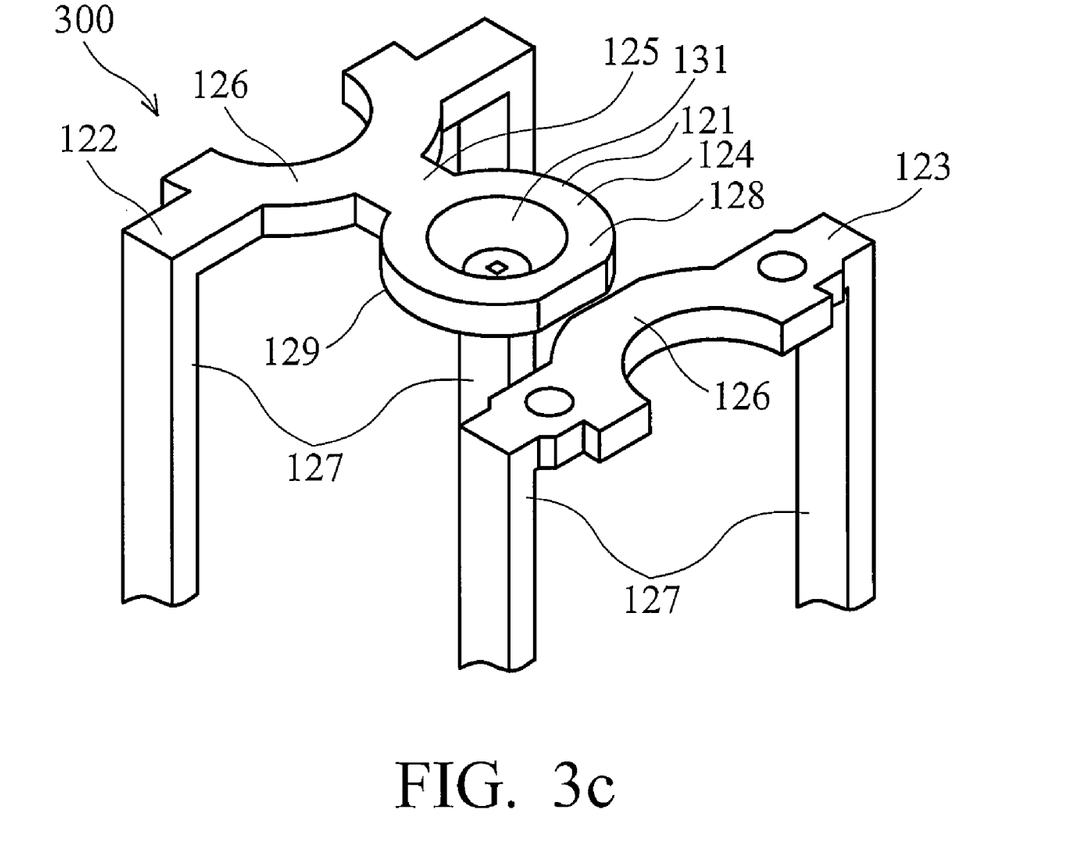
FIG. 3c shows a stereogram of a comparative embodiment of a lead frame of a high power LED package structure.

FIG. 3c shows a stereogram of a comparative embodiment of a lead frame 300. The lead frame 300 comprises a chip carrier 121, a first electrode 122 and a second electrode 123. The chip carrier 121 has an arc frame 124, a bulge 125. The first electrode 122 and the second electrode 123 each have a connector 126 and a pair of leads 127. The arc frame 124 is electrically connected to the bulge 125. The bulge 125 is electrically connected to the connector 126 of the first electrode 122. The connector 126 of the first electrode 122 is electrically connected to the lead 127 of the first electrode 122. The connector 126 of the second electrode 123 is electrically connected to the lead 127 of the second electrode 123. The chip carrier 121 has a first surface 128 and a second surface 129, wherein the second surface 129 is opposite to the first surface 128. The chip carrier 121 is used for carrying a high power LED chip 112 with input power greater than 1 watt. The first surface 128 of the chip carrier 121 has a recess 131 severed as a reflector cup with optical function. The high power LED chip 112 is connected to the recess 131 using a chip adhesive (not shown), for example, silver adhesive.

FIG. 4 is a front view/cross section taken substantially along line A-A' of FIG. 2a showing the heat dissipating path 144 of an exemplary embodiment of the high power LED package structure 100 placed on a printed circuit board (PCB) 143. In the high power LED package structure 100, heat generated from the LED chip 112 may be transported form the lead frame 113 to the PCB 143, or transported to the environment through the packaging material 111. The heat dissipating path 144 may have various directions. Generally speaking, most heat is transported form the lead frame 113 to the PCB 143 due to the lead frame 113 has much greater thermal conductivity than the packaging material 111.

In the first embodiment of the lead frame 200 of the high power LED package structure 100 the extended part 132 is connected to the arc frame 124 of the chip carrier 121. Thus, the lead frame 200 provides a greater heat dissipating area than the comparative embodiment of the lead frame 300. Heat generated from the high power LED chip 112 is transported from the lead frame 200 to a surface of the high power LED package structure 100. Additionally, the lead frame 200 combined with the heat dissipating material 137 has greater heat dissipating area, and the heat dissipating material 137 has greater thermal conductivity than the lead frame 300. Thus the high power LED package structure 100 with the lead frame 200 combined with the heat dissipating material 137 has higher heat dissipating efficiency than the high power LED package structure 100 with the lead frame 200 only. The heat dissipating material 137 may be exposed outside the packaging material 111 and connected to the PCB 143 directly to provide a greater heat dissipating area and better heat dissipating efficiency. The high power LED package structure 100 may be produced in the conventional piranha LED packaging process to maintain low manufacturing costs.

Figure 5A:
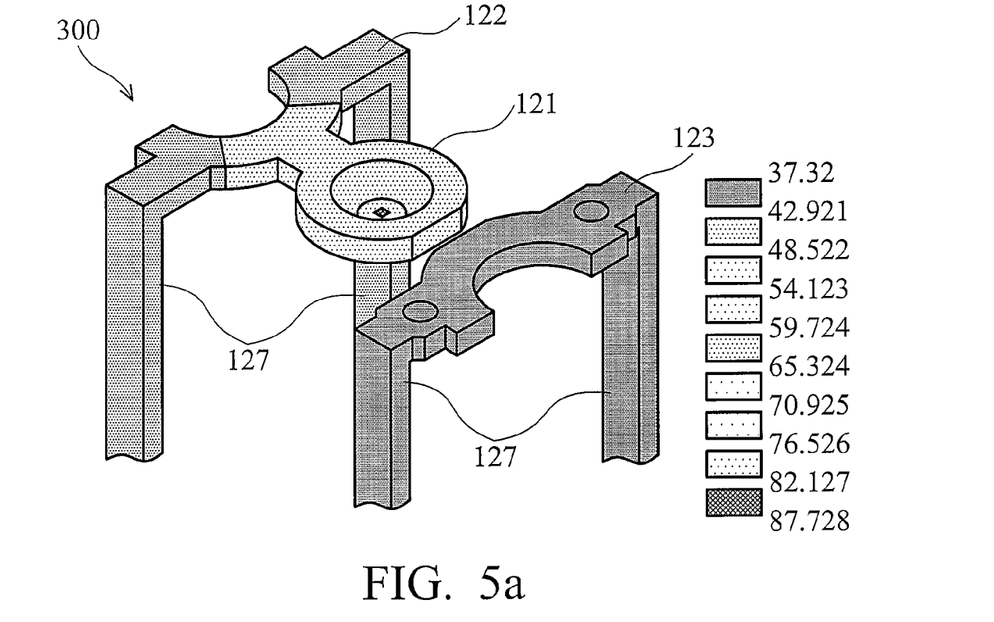
FIG. 5a is a simulation result showing a temperature distribution of the comparative example of a high power LED package structure as shown in FIG. 3c.
Figure 5B:
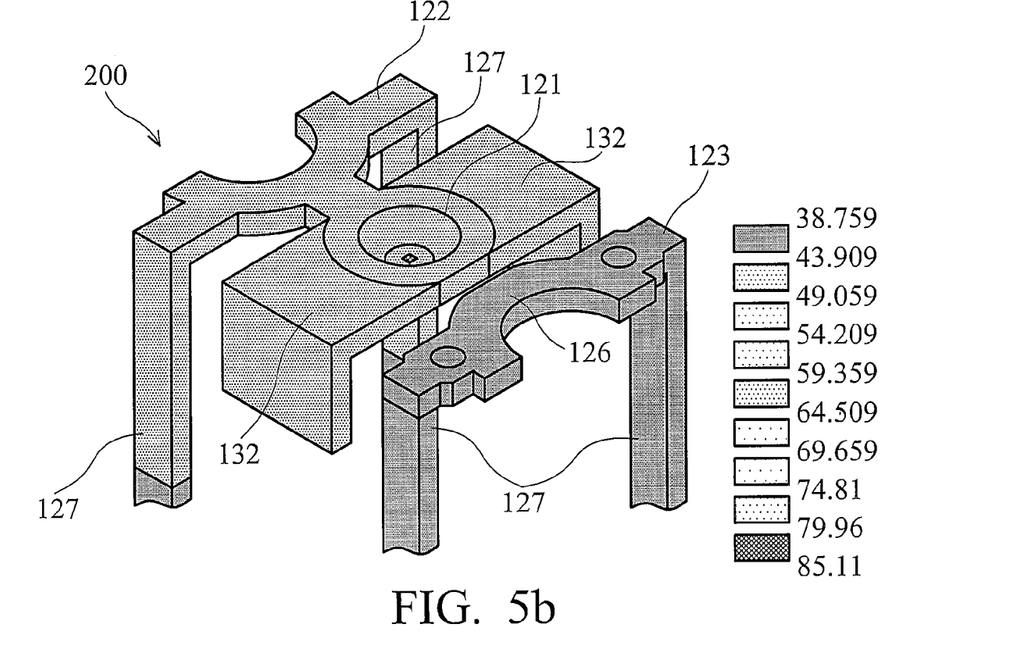
Figure 5C:
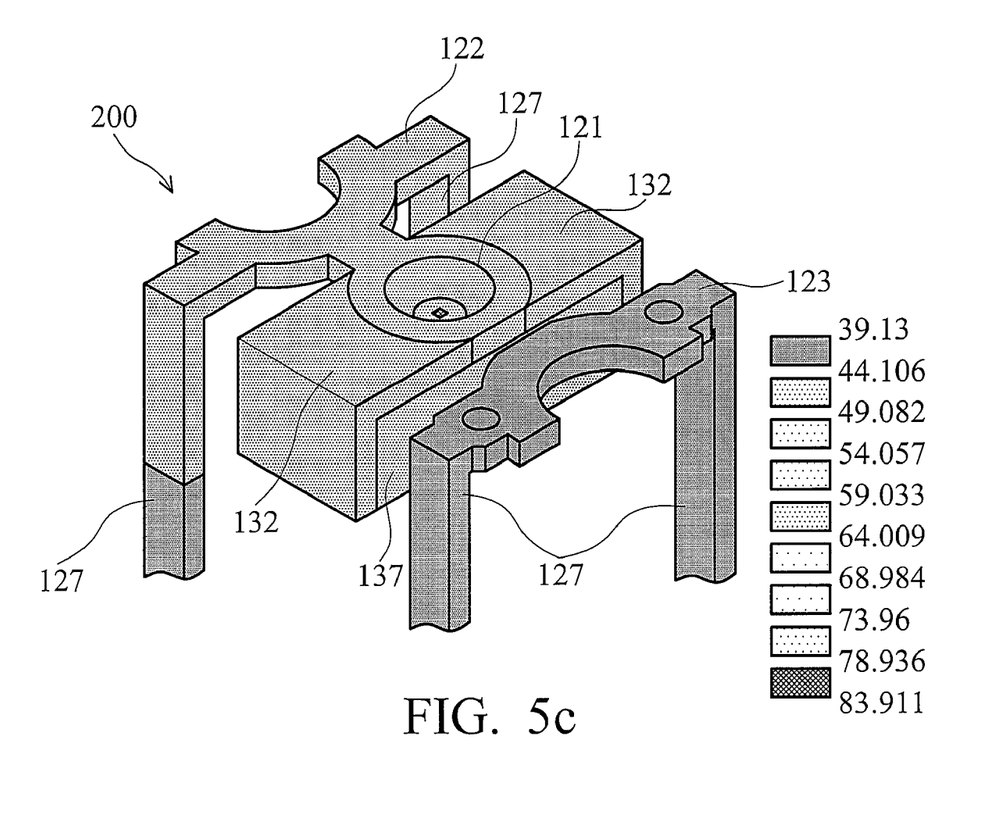
FIG. 5c is a simulation result showing a temperature distribution of the exemplary embodiment of a high power LED package structure as shown in FIG. 3b.

A software ANSYS® 5.6 provided by ANSYS Corp. is used to evaluate the heat dissipating efficiency of three exemplary embodiments of the LED package structure, the lead frame 300, the lead frame 200 and the lead frame 200 combined with the heat dissipating material 137. FIGS. 5a to 5c are simulation results respectively showing a temperature distribution of the lead frame 300, the lead frame 200 and the lead frame 200 combined with the heat dissipating material 137. These three exemplary embodiments of the LED package structure were placed at room temperature in a natural convection environment with a 0.1 watt input power. The highest temperature of these three exemplary embodiments of the LED package structure all occurred on the LED chip, and the results were respectively 87.7° C. of the lead frame 300, 85.1° C. of the lead frame 200, and 83.9° C. of the lead frame 200 combined with the heat dissipating material 137. The lead frame 200 combined with the heat dissipating material 137 shows the lowest temperature due to the better heat dissipating efficiency. Additionally, heat resistance ($R_{ja}$) is often used for heat dissipating efficiency evaluation and defined as:

$$R_{ja} = \frac{(T_j - T_a)}{P}.$$

$T_j$ and $T_a$ are, respectively, chip temperature and environmental temperature. Better heat dissipating efficiency results in smaller difference between $T_j$ and $T_a$ and smaller $R_{ja}$ at a constant input power. In the same way, worse heat dissipating efficiency results in a greater difference between $T_j$ and $T_a$ and greater $R_{ja}$ at a constant input power. The heat resistance ($R_{ja}$) of the three exemplary embodiments of the LED package structures is, respectively, 627° C./W of the lead frame 300, 601° C./W of the lead frame 200 and 589° C./W of the lead frame 200 combined with the heat dissipating material 137. Similarly, the lead frame 200 combined with the heat dissipating material 137 shows the lowest heat resistance, and thus has the best heat dissipating efficiency of the three exemplary embodiments of the LED package structure. The lead frame 300 is 38° C. higher than the lead frame 200 combined with the heat dissipating material 137 when the input power is increased to 1 watt. The heat resistance result shows the high power LED package structure 100 comprising the lead frame 200 combined with the heat dissipating material 137 can substantially dissipate heat form the LED chip.

From the simulation results, the exemplary high power LED package structure comprising the lead frame combined with the heat dissipating material has better heat dissipating efficiency. After forming the lead frame, the exemplary high power LED package structure can be completely formed in one step using the piranha LED packaging process. Compared with the conventional high power LED package packaging process, which comprises combining the lead and the housing first and then combining other elements, the exemplary high power LED package structure has the advantages of a simplified manufacturing process, higher throughput and lower cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode package structure, comprising:
a lead frame having a chip carrier, a pair of extended parts, a first electrode and a second electrode, the chip carrier having an arc frame enclosed by the extended parts and a bulge, the extended part having a first side, a first top and a first bottom, the first side connected to the arc frame of the chip carrier, each of the first electrode and the second electrode having a connector and a pair of leads, the arc frame electrically connected to the first electrode, the connector of the first electrode electrically connected to the lead of the first electrode, the connector of the second electrode electrically connected to the lead of the second electrode, the chip carrier having a first surface and a second surface, wherein the second surface is opposite to the first surface and the first surface has a recessed reflector cup with optical function;
a light emitting diode chip placed on the first surface of the chip carrier;
a conductive wire having two terminals connected to the light emitting diode chip and the connector of the second electrode; and
a packaging material having a first thermal conductivity covering the lead frame and the light emitting diode chip.

2. The light emitting diode package structure as claimed in claim 1, wherein the light emitting diode chip is placed on the reflector cup.

3. The light emitting diode package structure as claimed in claim 1, wherein the light emitting diode chip has a power greater than about 1 watt.

4. The light emitting diode package structure as claimed in claim 1, wherein the connector comprises a U-shaped area.

5. The light emitting diode package structure as claimed in claim 1, wherein the conductive wire comprises Au, Ag, Cu, W, Ni, Si, Al, Mo or an alloy thereof, ceramic composite, diamond-like material or metal oxide.

6. The light emitting diode package structure as claimed in claim 1, wherein a shape of the connector has a planar shape or an L-shape.

7. The light emitting diode package structure as claimed in claim 1, further comprising:
a heat dissipating material placed on the second surface of the chip carrier, wherein the heat dissipating material has a second top, a second bottom, a pair of third sides, and a pair of fourth sides, and the second top of the dissipating material connects to the second surface of the chip carrier and the first bottom of the extended part.

8. The light emitting diode package structure as claimed in claim 7, wherein the second top and the third sides of the heat dissipating material connects to the first bottom of the extended part.

9. The light emitting diode package structure as claimed in claim 7, wherein the heat dissipating material has a second thermal conductivity greater than the first thermal conductivity.

10. The light emitting diode package structure as claimed in claim 7, wherein the packaging material has a third bottom facing the same direction with the second surface of the chip carrier.

11. The light emitting diode package structure as claimed in claim 7, wherein the second bottom of the heat dissipating material is aligned with the third bottom of the packaging material.

12. The light emitting diode package structure as claimed in claim 7, wherein the second bottom of the heat dissipating material bulges out to the third bottom of the packaging material.

13. The light emitting diode package structure as claimed in claim 1, wherein the lead frame comprises Au, Ag, Cu, W, Ni, Si, Al, Mo or an alloy thereof, ceramic composite, diamond-like material or metal oxide.

14. The light emitting diode package structure as claimed in claim 1, wherein the lead frame is formed by injection molding.

15. The light emitting diode package structure as claimed in claim 1, wherein the packaging material comprises a lens.

16. The light emitting diode package structure as claimed in claim 1, wherein the packaging material is formed by mold filling.

17. The light emitting diode package structure as claimed in claim 1, wherein the packaging material comprises epoxy.

* * * * *